United States Patent
Mukherjee et al.

(10) Patent No.: US 7,005,920 B2
(45) Date of Patent: Feb. 28, 2006

(54) PROGRAMMABLE PASSIVE INDUCTOR

(75) Inventors: Debanjan Mukherjee, San Jose, CA (US); Jishnu Bhattacharjee, San Jose, CA (US)

(73) Assignee: Scintera Network, San Jose, CA (US)

( * ) Notice: Subject to any disclaimer, the term of this patent is extended or adjusted under 35 U.S.C. 154(b) by 0 days.

(21) Appl. No.: 11/206,464

(22) Filed: Aug. 18, 2005

(65) Prior Publication Data

US 2005/0275458 A1   Dec. 15, 2005

Related U.S. Application Data

(62) Division of application No. 10/698,317, filed on Oct. 30, 2003.

(51) Int. Cl.
*H03F 3/45*   (2006.01)

(52) U.S. Cl. ............... 330/253; 330/169; 330/188; 336/220

(58) Field of Classification Search ............... 330/253, 330/165, 188, 169; 336/220, 200
See application file for complete search history.

(56) References Cited

U.S. PATENT DOCUMENTS

| | | | |
|---|---|---|---|
| 5,952,893 A * | 9/1999 | Ghoshal | 331/108 C |
| 6,417,737 B1 * | 7/2002 | Moloudi et al. | 330/301 |
| 6,690,243 B1 * | 2/2004 | Henrion | 331/117 R |
| 6,803,829 B1 * | 10/2004 | Duncan et al. | 331/34 |
| 2004/0257152 A1 * | 12/2004 | Kwok | 327/552 |

* cited by examiner

*Primary Examiner*—Patricia Nguyen
(74) *Attorney, Agent, or Firm*—MacPherson Kwok Chen & Heid LLP; Tom Chen

(57) ABSTRACT

A programmable passive inductor includes two inductors or coils, each having a self-inductance, magnetically coupled together and having a mutual inductance proportional to a magnetic coupling factor. The relative magnitude of the currents through the two inductors can be dynamically varied, which changes the effective inductance.

6 Claims, 1 Drawing Sheet

PROGRAMMABLE PASSIVE INDUCTOR

This application is a divisional of U.S. patent application Ser. No. 10/698,317, filed Oct. 30, 2003, which is herein incorporated by references for all purposes.

BACKGROUND

1. Field of the Invention

The present invention relates to inductor circuits, and in particular, to such circuits that allow variable inductances.

2. Related Art

As is well known, inductors generate an electromotive force by changing the current flowing through the inductor. In its simplest form, an inductor is a coiled conducting wire with N number of turns. Inductors can be used in a wide range of applications, such as for impedance matching and loading in low noise amplifiers, broadband amplifiers, power amplifiers, mixers and analog filters, as well as for providing frequency-selective resonant circuits in variable-frequency oscillators in such RF-wireless products. However, with many applications, as the frequency of operation of a device increases, the circuit becomes more complicated, and narrow variation and strict tolerance are required for the components to operate properly. Thus, it is desirable to be able to adjust the parameters of the circuit, such as the inductance, to finely tune for variations in the components as well as to allow variable operation of the circuit. Furthermore, in certain applications, it is desirable to vary the amount of inductance in a circuit. For example, in a circuit that has a time varying capacitive load or a varying frequency of operation, the circuit may be tuned by varying the inductance to minimize the reactive current required to be supplied by a power source.

Conventionally, active inductors are used in integrated circuits that require tuning or varying the inductance values. However, active inductors have several disadvantages, including degraded noise performance, higher distortion, relatively high power requirements, lower quality or Q factor (i.e., the relative absence of resistive losses) than passive inductors, and limited dynamic range. In addition, active inductors are limited in their operation to lower speeds and are not capable of providing variable inductance at high speed.

Passive inductors provide some advantages over active inductors, such as higher quality factor, better noise performance, and no extra power consumption. Passive inductors also provide better performance with high speed circuits and have wideband inductance up to their self-resonant frequency. However, changing the inductance of passive inductors is often burdensome. Inductance is typically changed by altering its physical characteristics, such as length, diameter, number of turns, and wire thickness. However, once those physical characteristic are set, the inductance if fixed, such that any change would require changing a physical characteristic, such as altering the separation between coils, or switching in a new inductor. Inductance can also be varied by connecting wires, commonly known as taps, at various locations throughout the coil and extending the wires to contact switches located at some distance from the coil. However, the use of many taps may also result in the formation of undesirable parallel resonance circuits and a lowered overall Q factor for the circuit, thereby reducing the sharpness of the circuit response at the selected frequency.

Accordingly, there is a need for a variable inductor that overcomes the deficiencies in the prior art as discussed above.

SUMMARY

According to one aspect of the present invention, the effective inductance of a passive inductor structure is controlled by changing the effective mutual inductance between a first inductor or coil and a second inductor or coil. The two inductors are designed to form a transformer structure with a magnetic coupling factor k. The relative strength of the alternating currents between the inductors is changed to vary the effective inductance of both the inductors. Accordingly, the relative magnitude of the currents between two inductors is changed, which controls the effective mutual inductance and effective inductance. The phase difference between the currents can also be changed to vary the impedance or inductance. Thus, the present invention allows a passive inductor to be dynamically programmed with different inductances.

In one embodiment, the passive inductor structure is used in a shunt-peaked multi-gigahertz broadband amplifier to provide with programmable front-end magnitude response for analog/digital continuous/discrete time filters/equalizers. This magnitude shaping can compensate process dependent bandwidth variations of the equalizer core and can adapt the bandwidth of the equalizer for different channels. Input signal amplitude can be increased over desired frequency ranges for improved performance.

This invention will be more fully understood in conjunction with the following detailed description taken together with the following drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

According to one aspect of the invention, the inductance of an inductor circuit is changed by varying the magnitude of a current through one of the two inductor coils, where the two inductor coils are coupled to form a transformer. The change in current changes the effective inductance of the circuit.

Figure 1:
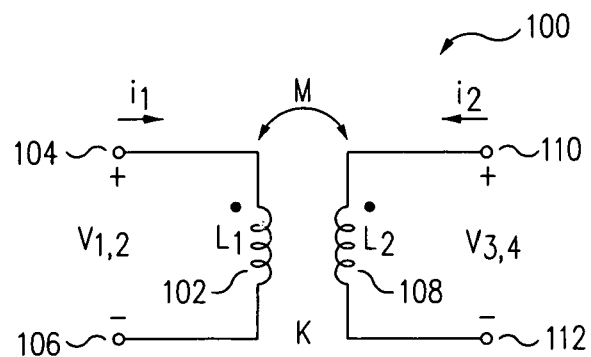
FIG. 1 shows a programmable passive inductor according to one embodiment.

FIG. 1 shows a programmable or variable passive inductor 100 according to one embodiment. Programmable inductor 100 includes a first inductor 102 having a first end 104 and a second end 106 and a second inductor 108 having a first end 110 and a second end 112. In one embodiment, first and second inductors 102 and 108 are coiled conductive wires. First inductor 102 has a self inductance $L_1$, and second inductor 108 has a self inductance $L_2$. Current $i_1$ flows through primary or first inductor 102 from first end 104 to second end 106, while a current $i_2$ flows through secondary or second inductor 108 from first end 110 to second end 112. The mutual inductance M between first inductor 102 and second inductor 108 (and vice versa) is given as follows:

$$M = k\sqrt{L_1 L_2} \tag{1}$$

where k is the coupling factor of the two inductors and typically fixed by device geometry. Thus, the voltage $v_{1,2}$ across the primary inductor and the voltage $V_{3,4}$ across the secondary inductor are given by equations (2) and (3), respectively:

$$v_{1,2} = L_1 \frac{di_1}{dt} + M \frac{di_2}{dt} \quad (2)$$

$$v_{3,4} = M \frac{di_1}{dt} + L_1 \frac{di_2}{dt} \quad (3)$$

In one embodiment, the frequency of the two currents $i_1$ and $i_2$ are the same and are given below as follows:

$$i_1 = I_0 e^{jwt} \quad (4)$$

$$i_2 = I_0 C e^{j(wt+\theta)} \quad (5)$$

where C is a current magnitude scaling factor, to be discussed in more detail below, and $\theta$ is the phase difference between $i_1$ and $i_2$.

Substituting equations (4) and (5) into equation (2) results in the following:

$$\begin{aligned}
v_{1,2} &= j\omega L_1 I_0 e^{jwt} + j\omega M I_0 C e^{j(wt+\theta)} \quad (6)\\
&= (L_1 + CM e^{j\theta}) j\omega I_0 e^{jwt}\\
&= (L_1 + CM e^{j\theta}) \frac{di_1}{dt}\\
&= L_{eff} \frac{di_1}{dt}
\end{aligned}$$

where $L_{eff}$ is equal to $L_1 + CMe^{j\theta}$ and is the effective inductance between first end 104 and second end 106 (of the primary coil).

Expanding $e^{j\theta}$ results in the following:

$$\begin{aligned}
v_{1,2} &= (L_1 + CMe^{j\theta}) j\omega I_0 e^{jwt} \quad (7)\\
&= [L_1 + CM(\cos\theta + j\sin\theta)] j\omega I_0 e^{jwt}\\
&= [j\omega L_1 + j\omega CM\cos\theta - C\omega M\sin\theta] I_0 e^{jwt}\\
&= [-C\omega M\sin\theta + j\omega(L_1 + CM\cos\theta)] i_1(t)
\end{aligned}$$

As seen from equation (7), the effective resistance (or impedance) can be changed by varying the phase $\theta$, mutual inductance M, self-inductance $L_1$, current magnitude scaling factor C, and/or frequency $\omega$. With a passive inductor, the inductance $L_1$ of inductor 102 and the mutual inductance M are both typically fixed with geometry and other device parameters. For example, the self-inductance $L_1$ is dependent on geometry and the dielectric and magnetic properties of the surroundings. The mutual inductance M depends on the coupling factor k, but k is dependent on the geometry and dielectric and magnetic properties of the surroundings, both of which cannot be changed dynamically. However, according to the present invention, the effective inductance $L_{eff}$ can be varied dynamically by changing the phase $\theta$ difference and/or the magnitude scaling factor C.

For example, when the phases are the same, i.e., $\theta=0$, $L_{eff}$ is equal to $L_1 + CM$, and when the two currents are 180° out of phase, $L_{eff}$ is equal to $L_1 - CM$. With C being constant, the effective inductance can be varied between $L_1 + CM$ and $L_1 - CM$. However, if $\theta$ is different from 0° or 180°, the real (or resistive) component of the impedance $C\omega M\sin\theta$ is no longer zero so that the effective resistance associated with the inductance also changes. This effect can be used constructively, e.g., to enhance the Q factor of an inductor, providing tuned load/matching circuits for low noise amplifiers (LNAs), mixers, and the like. Typically, it is desirable to keep $\theta$ equal to 0° or 180° and vary only coefficient C so that only the imaginary/reactive component (i.e the inductance) of the impedance is varied and not the real (or resistive) component.

However, although $\theta=0°$ or 180° is typically desired, phase mismatches or variations can be tolerated with the circuit of the present invention since circuit performance is relatively insensitive within a range of phases variations around 0° and 180°. In one embodiment, phase mismatches up to ±20° can be tolerated.

Assuming that the phase difference is zero, the effective inductance is a function if C and can be varied according to the equation below:

$$L_{eff}(C) = L_1 + CM \quad (8)$$

In one embodiment, C can be chosen to be any value between the magnitude of $i_1$ and $i_2$. In another embodiment, C is chosen between +1 and −1. For example, assuming the coupling factor k is one and $L_1 = L_2 = L$, then $L_{eff}$ can be varied between 0 and 2L. Thus, C can be selected to tune the circuit or vary the inductance within a range to a desired value. Changing C changes the relative strengths of currents $i_1$ and $i_2$. The programmable passive inductor of the present invention can be used in many types of circuits in which variable inductances are desired, such as in a shunt-peaked multi-gigahertz broadband amplifier to provide programmable front-end magnitude response for analog/digital continuous/discrete time filters/equalizers, such as described in commonly-owned U.S. patent application Ser. No. 10/290,993, filed Nov. 8, 2002, entitled "Adaptive Signal Equalizer with Adaptive Error Timing and Precursor/Postcursor Configuration Control", Ser. No. 10/322,024, filed Dec. 17, 2002, entitled "Adaptive Coefficient Signal Generator for Adaptive Signal Equalizers with Fractionally-Spaced Feedback", Ser. No. 10/426,588, filed Apr. 29, 2003, entitled "Adaptation Structure And Methods For Analog Continuous Time Equalizers", and UNKNOWN, filed Jul. 3, 2003, entitled "Channel Monitoring And Identification And Performance Monitoring In A Flexible High Speed Signal Processor Engine", all of which are incorporated by reference in their entirety. Magnitude shaping can compensate process dependent bandwidth variations of the equalizer core and can adapt the bandwidth of the equalizer for different channels.

Figure 2:
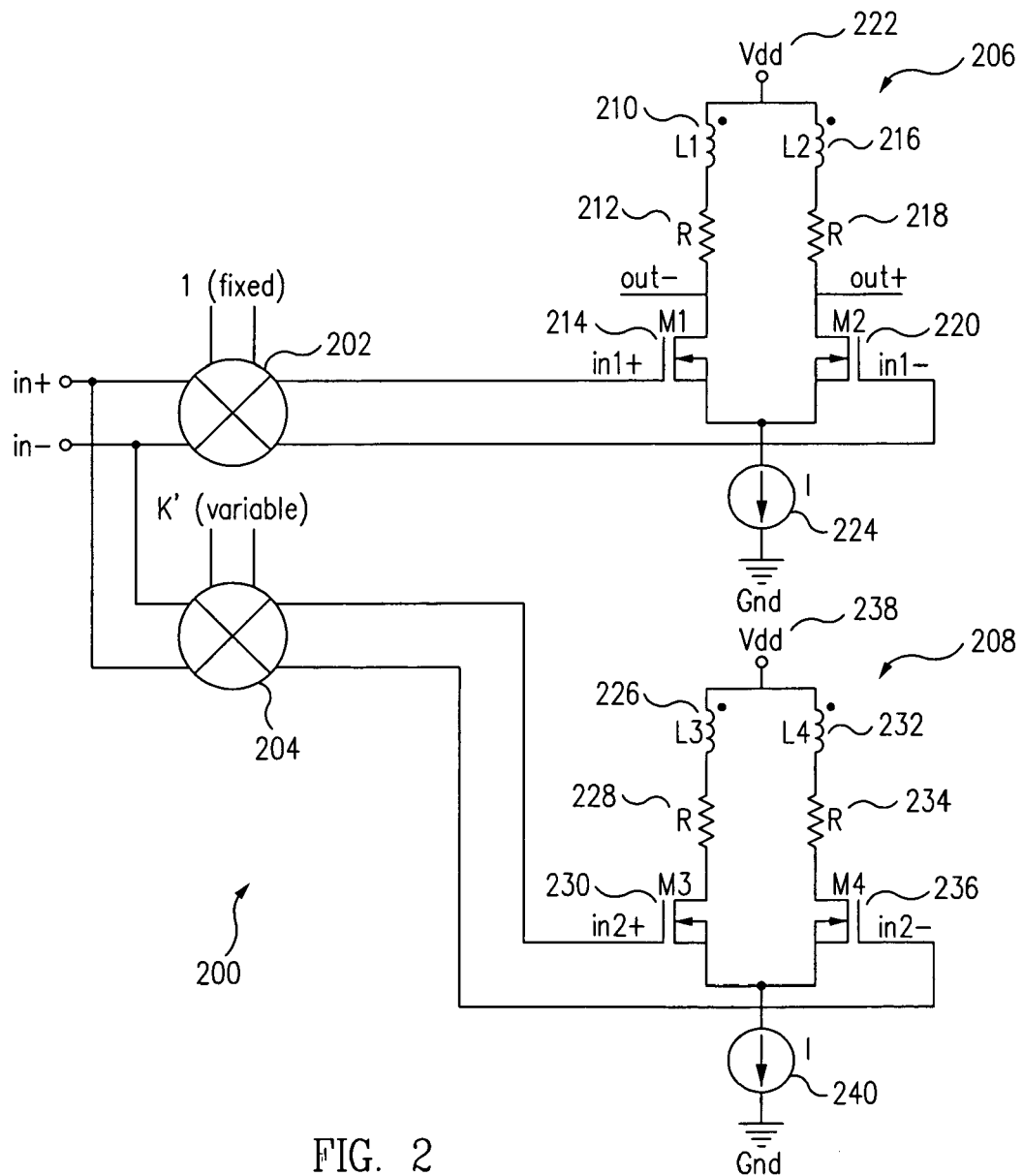
FIG. 2 shows a circuit for use with the programmable inductor according to one embodiment.

FIG. 2 shows a differential shunt-peaked amplifier 200 using the programmable inductor of the present invention, according to one embodiment. A first multiplier 202 and a second multiplier 204 are coupled to receive the same input alternating current. The output of first multiplier 202 is coupled to a differential amplifier 206, and the output of second multiplier 204 is coupled to a second differential amplifier 208. In one embodiment, first and second multipliers 202 and 204 are identical and first and second differential amplifiers 206 and 208 are identical, which ensures that current through the inductors are in phase. First differential amplifier 206 includes a first inductor 210, a first resistor 212, and a first transistor 214, all connected in series, and a second inductor 216, a second resistor 218, and a second transistor 220, all connected in series. Both inductor/resistor/transistor chains are connected in parallel to a voltage source 222 at one end and a current source 224 on the other end.

Similarly, second differential amplifier 208 includes a first inductor 226, a first resistor 228, and a first transistor 230, all connected in series, and a second inductor 232, a second resistor 234, and a second transistor 236, all connected in series. Again both inductor/resistor/transistor chains are connected in parallel to a voltage source 238 at one end and a current source 240 on the other end. In one embodiment, the inductances of inductors 210, 216, 226, and 232 are the same, while inductors 210 and 226 are magnetically coupled with a coupling factor k and inductors 216 and 232 are magnetically coupled, also with a coupling factor k. In an integrated design, the magnetic coupling k between two inductor structures can be obtained by putting two (stacked/single layer) inductors on top of each other. The spatial separation between the structures will control the mutual inductance.

The current input to second multiplier 204 is multiplied by variable C, which controls the relative magnitude of the current flowing through second differential amplifier 208 and through inductors 226 and 232 (i.e., the primary inductor coils). Thus, the effective inductance can be changed according to equation (7) above by varying the value of C to tune the circuit for front-end magnitude shaping, such as for equalizers. The output of the shunt-peak amplifier circuit is taken between first resistor 212 and first transistor 214 and between second resistor 218 and second transistor 220 of first differential amplifier 206, which can then be used, for example, in the front end of an analog equalizer. The current input to first multiplier 202 is a fixed constant, such as unity, to provide a delay to match the delay resulting from second multiplier 204.

Thus, using the present invention, effective inductances of a circuit can be programmed or varied by simply changing the relative magnitude of the current through the primary and secondary winding of magnetically coupled inductors. This technique relaxes the constraint in designs where precise inductance and/or mutual coupling is required and gives more robustness. Flexibility in circuit design is also improved, as one circuit can be easily programmed with many different inductance values.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. An amplifier circuit, comprising:
    a first multiplier configured to receive input signals, wherein the first multiplier multiplies the signals with a constant;
    a second multiplier configured to receive the input signals, wherein the second multiplier multiplies the signals with a variable factor C;
    a first differential amplifier coupled to receive output signals from the first multiplier, wherein the first differential amplifier comprises a first and a second inductor in parallel and provides an output for the circuit; and
    a second differential amplifier coupled to receive output signals from the second multiplier, wherein the second differential amplifier comprises a third and a fourth inductor in parallel, wherein the first and third inductors are coupled with a coupling factor k and the second and fourth inductors are coupled with a coupling factor k.

2. The circuit of claim 1, wherein the input signals are alternating currents.

3. The circuit of claim 1, wherein the variable factor C is varied to change the effective impedance of the circuit.

4. The circuit of claim 1, wherein the first and second multipliers and the first and second differential amplifiers are the same.

5. The circuit of claim 1, wherein the constant is unity.

6. The circuit of claim 1, wherein the first differential amplifier further comprises:
    a first voltage source coupled to the first and second inductors;
    first and second resistors coupled in series to the first and second inductors, respectively;
    first and second transistors coupled in series to the first and second resistors, respectively; and
    a first current source coupled to the first and second transistors, wherein the output is between the first resistor and transistor and the second resistor and transistor;
and the second differential amplifier further comprises:
    a second voltage source coupled to the second and third inductors;
    third and fourth resistors coupled in series to the third and fourth inductors, respectively;
    third and fourth transistors coupled in series to the third and fourth resistors, respectively; and
    a second current source coupled to the third and fourth transistors, wherein the output is between the third resistor and transistor and the fourth resistor and transistor.

* * * * *